(12) United States Patent
Campanella-Pineda et al.

(10) Patent No.: US 12,297,100 B2
(45) Date of Patent: **\*May 13, 2025**

(54) ELECTRONIC ACOUSTIC DEVICES, MEMS MICROPHONES, AND EQUALIZATION METHODS

(71) Applicant: SKYWORKS SOLUTIONS, INC., Irvine, CA (US)

(72) Inventors: Humberto Campanella-Pineda, Singapore (SG); Michael Jon Wurtz, Lake Oswego, OR (US); Rakesh Kumar, Singapore (SG); You Qian, Singapore (SG); Guofeng Chen, Fremont, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 182 days.

This patent is subject to a terminal disclaimer.

(21) Appl. No.: 18/045,885

(22) Filed: Oct. 12, 2022

(65) Prior Publication Data
US 2023/0121053 A1 Apr. 20, 2023

Related U.S. Application Data

(60) Provisional application No. 63/255,732, filed on Oct. 14, 2021.

(51) Int. Cl.
*H04R 3/00* (2006.01)
*B81B 7/02* (2006.01)
*H04R 17/02* (2006.01)

(52) U.S. Cl.
CPC .............. *B81B 7/02* (2013.01); *H04R 3/00* (2013.01); *H04R 17/02* (2013.01);
(Continued)

(58) Field of Classification Search
CPC .............. B81B 7/02; H04R 3/00; H04R 17/02
See application file for complete search history.

(56) References Cited

U.S. PATENT DOCUMENTS

| 4,631,749 A | 12/1986 | Rapaich |
| 8,204,252 B1 | 6/2012 | Avendano |
| (Continued) | | |

FOREIGN PATENT DOCUMENTS

| CN | 106921928 A | 7/2017 |
| GB | 2582386 A | 9/2020 |
| WO | 2015013698 A1 | 1/2015 |

OTHER PUBLICATIONS

Combined Search and Examination Report from corresponding United Kingdom Application No. 2215011.4 dated Feb. 28, 2023.

*Primary Examiner* — Simon King
(74) *Attorney, Agent, or Firm* — Lando & Anastasi, LLP

(57) ABSTRACT

Electronic acoustic devices and methods of operating the same include a microphone having a frequency response including a resonance frequency, a reference microphone having a frequency response including a resonance frequency, the microphone and the reference microphone configured to substantially simultaneously receive a common acoustic signal to produce a transduced signal of the microphone and a transduced signal of the reference microphone, the resonance frequency of the reference microphone being different than the resonance frequency of the microphone, and an equalization module configured to equalize the frequency response of the microphone based on the transduced signal of the microphone and the transduced signal of the reference microphone.

20 Claims, 12 Drawing Sheets

(52) U.S. Cl.
CPC ............... *B81B 2201/0257* (2013.01); *B81B 2203/0118* (2013.01); *B81B 2203/0127* (2013.01); *B81B 2203/0307* (2013.01); *B81B 2203/0315* (2013.01); *B81B 2203/04* (2013.01); *B81B 2207/015* (2013.01); *H04R 2201/003* (2013.01)

(56) References Cited

U.S. PATENT DOCUMENTS

| | | | |
|---|---|---|---|
| 8,351,634 B2 | 1/2013 | Khenkin | |
| 8,618,619 B1 | 12/2013 | Miks et al. | |
| 9,813,833 B1 | 11/2017 | Vesa | |
| 2003/0133588 A1* | 7/2003 | Pedersen | H04R 19/005 381/396 |
| 2005/0254673 A1* | 11/2005 | Hsieh | H04R 19/016 381/175 |
| 2010/0128914 A1 | 5/2010 | Khenkin | |
| 2010/0254547 A1* | 10/2010 | Grosh | B81B 3/0021 381/114 |
| 2011/0243343 A1* | 10/2011 | Gauger, Jr. | G10K 11/16 381/71.6 |
| 2011/0272769 A1 | 11/2011 | Song et al. | |
| 2012/0124743 A1 | 5/2012 | Hensley et al. | |
| 2012/0241937 A1 | 9/2012 | Chan et al. | |
| 2012/0250925 A1 | 10/2012 | Lillelund | |
| 2013/0051598 A1 | 2/2013 | Reining | |
| 2014/0037115 A1 | 2/2014 | Vos et al. | |
| 2014/0044297 A1 | 2/2014 | Loeppert et al. | |
| 2014/0233756 A1* | 8/2014 | Inoda | H04R 1/38 381/91 |
| 2015/0289045 A1* | 10/2015 | Khenkin | H04R 19/005 381/150 |
| 2016/0043664 A1 | 2/2016 | Theuss et al. | |
| 2016/0165358 A1 | 6/2016 | Ho et al. | |
| 2016/0178372 A1 | 6/2016 | Pun et al. | |
| 2017/0048623 A1* | 2/2017 | Qutub | H04R 19/005 |
| 2017/0320726 A1 | 11/2017 | Leitgeb et al. | |
| 2018/0167742 A1 | 6/2018 | Brioschi et al. | |
| 2018/0234751 A1 | 8/2018 | Lee | |
| 2018/0244516 A1 | 8/2018 | Piechocinski | |
| 2018/0317021 A1 | 11/2018 | Dehe et al. | |
| 2019/0017893 A1* | 1/2019 | Tumpold | G01L 27/005 |
| 2020/0007992 A1* | 1/2020 | Koymen | H04R 31/006 |
| 2020/0017351 A1 | 1/2020 | Schultz et al. | |
| 2020/0304923 A1 | 9/2020 | Brioschi et al. | |
| 2020/0404407 A1 | 12/2020 | Hrudey et al. | |
| 2021/0329378 A1* | 10/2021 | Zhang | H04R 1/02 |
| 2021/0400366 A1* | 12/2021 | LoPresti | H04R 19/005 |
| 2022/0276149 A1* | 9/2022 | Kuyken | G01N 21/1702 |
| 2023/0061686 A1* | 3/2023 | Wolfl | H04R 1/2853 |
| 2023/0121053 A1* | 4/2023 | Campanella-Pineda | H04R 19/005 381/111 |
| 2023/0269524 A1 | 8/2023 | Chen et al. | |
| 2023/0269525 A1 | 8/2023 | Chen et al. | |
| 2023/0283963 A1 | 9/2023 | Chen et al. | |
| 2023/0328426 A1 | 10/2023 | Campanella-Pineda et al. | |

\* cited by examiner

ELECTRONIC ACOUSTIC DEVICES, MEMS MICROPHONES, AND EQUALIZATION METHODS

CROSS-REFERENCE TO RELATED APPLICATIONS

This application claims priority under 35 U.S.C. § 119(e) to U.S. Provisional Patent Application Ser. No. 63/255,732, titled "ELECTRONIC ACOUSTIC DEVICES, MEMS MICROPHONES, AND EQUALIZATION METHODS," filed Oct. 14, 2021, the entire contents of which is incorporated by reference herein for all purposes.

BACKGROUND

Field

Embodiments of the invention relate to microelectromechanical systems (MEMS). More particularly, at least some embodiments are directed to frequency response equalization of MEMS transducers, such as microphones.

Description of the Related Technology

The frequency response of a transducer, such as a microphone is the frequency-specific output sensitivity of the transducer. Resonance occurs when a physical object or electronic circuit absorbs energy from an initial displacement or source, and then maintains the resultant mechanical or electrical vibrations without an additional force or energy acting on it. The frequency at which this vibration occurs is known as the resonant frequency. The resonant frequency of a microphone is potentially troublesome when it shows up in the audio band as it may cause damage to the listener's ears and/or an inaccurate reproduction of the sound being sensed Eliminating this resonance is crucial to successful microphone performance.

A MEMS microphone is a micro-machined electromechanical device used to convert sound pressure (e.g., voice sound) to an electrical signal (e.g., voltage). MEMS microphones are widely used in wireless devices, mobile devices, headsets, earpieces, speakers and other voice-interface devices or systems. Conventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), and are robust and immune to water and dust contamination. Both conventional capacitive and piezoelectric MEMS microphones suffer from the problem of resonance in the audio band.

Prior attempts of eliminating or at least reducing resonance in MEMS microphones have included several different approaches. Some solutions add specific features in the microphone's structure to remove the resonance peak from the audio band. Other solutions include multiband processing to address the band around the resonance and to compensate for extra peaks in the frequency response. Another solution is to tailor the microphone's packaging to modify the resonance frequency, thereby pushing the resonance frequency out of the human perceivable audio band. The microphone could also be calibrated at the factory, using pink noise for example, to add a fixed frequency notch at the resonance frequency to compensate for the peak. However, none of these prior solutions offer a way to satisfactorily remove the resonance frequency from the audio band for a specific microphone once it has left the factory and is in the presence of unpredictable real-world noise.

SUMMARY

According to at least one embodiment there is provided an electronic acoustic device comprising a microphone having a frequency response including a resonance frequency, a reference microphone having a frequency response including a resonance frequency, the microphone and the reference microphone configured to substantially simultaneously receive a common acoustic signal to produce a transduced signal of the microphone and a transduced signal of the reference microphone, the resonance frequency of the reference microphone being different than the resonance frequency of the microphone, and an equalization module configured to equalize the frequency response of the microphone based on the transduced signal of the microphone and the transduced signal of the reference microphone.

In one example, a sensitivity of the microphone is higher than a sensitivity of the reference microphone.

In another example, each of the microphone and the reference microphone is a micro-electromechanical system (MEMS) microphone.

In one example, the equalization module is further configured to equalize the frequency response of the microphone by filtering the frequency response of the microphone with an equalization function, the equalization function based on the transduced signal of the reference microphone being produced responsive to the reference microphone receiving the common acoustic signal.

In another example, the equalization module is further configured to equalize the frequency response of the microphone by estimating a power spectrum of the transduced signal of the reference microphone, calculating a cross-correlation of time-domain samples of the transduced signal of the microphone and the transduced signal of the reference microphone, calculating a frequency-domain power spectrum estimate of the cross-correlation, and dividing the frequency-domain power spectrum estimate of the cross-correlation by the power spectrum estimate of the reference microphone to produce a transfer function of the microphone.

In one example, the equalization module is further configured to equalize the frequency response of the microphone by determining a fitting polynomial of order N of the transfer function, where N≥2 and determining the equalization function of the microphone by calculating the inverse of the fitting polynomial.

In another example, the electronic acoustic device further comprises a packaging system that encloses the microphone, the reference microphone, and the equalization module.

In one example, the electronic acoustic device further comprises at least one back-side cavity defined by a volume between the packaging system, the microphone, and the reference microphone.

In another example, the at least one back-side cavity includes a first back-side cavity and a second back-side cavity, the first back-side cavity being acoustically isolated from the second back-side cavity.

In one example, the electronic acoustic device further comprises at least one port configured to receive the common acoustic signal and at least one front cavity configured to permit the common acoustic signal to substantially simultaneously reach the microphone and the reference microphone through the at least one port.

In another example, the at least one port comprises a first port and a second port, and the at least one front cavity comprises a first front cavity and a second front cavity, the first port and the second port configured to receive the common acoustic signal substantially simultaneously, the first front cavity configured to permit the common acoustic signal to reach the microphone through the first port and second front cavity configured to permit the common acoustic signal to reach the reference microphone through the second port.

In one example, the microphone and the reference microphone are co-located and co-planar.

In another example, the resonance frequency of the reference microphone is higher than the resonance frequency of the microphone.

In one example, the resonance frequency of the reference microphone is lower than the resonance frequency of the microphone.

In another example, the equalization module is one of an ASIC controller and a DSP controller.

According to at least one embodiment there is provided an acoustic equalization method comprising exciting a microphone and a reference microphone substantially simultaneously with a common acoustic signal to produce a transduced signal of the microphone and a transduced signal of the reference microphone, the microphone having a frequency response including a resonance frequency and the reference microphone having a frequency response including a resonance frequency, the resonance frequency of the reference microphone being different than the resonance frequency of the microphone, generating a transduced signal of the reference microphone responsive to the reference microphone receiving the common acoustic signal, and equalizing the frequency response of the microphone based on the transduced signal of the microphone and the transduced signal of the reference microphone.

In one example, the acoustic equalization method further comprises estimating a transfer function of the microphone based on the transduced signal of the microphone and the transduced signal of the reference microphone.

In another example, estimating the transfer function of the microphone comprises estimating a power spectrum of the transduced signal of the reference microphone, calculating a cross-correlation of time-domain samples of the transduced signal of the microphone and the transduced signal of the reference microphone, calculating a frequency-domain power spectrum estimate of the cross-correlation, and dividing the frequency-domain power spectrum estimate of the cross-correlation by the power spectrum estimate of the reference microphone to produce the transfer function of the microphone.

In one example, the acoustic equalization method further comprises determining an equalization function of the microphone based on the estimated transfer function, and equalizing the frequency response of the microphone by filtering the frequency response of the microphone with the equalization function.

In another example, determining the equalization function of the microphone comprises determining a fitting polynomial of order N of the transfer function, where $N \geq 2$ and determining the equalization function of the microphone by calculating the inverse of the fitting polynomial.

In one example, the acoustic equalization method further comprises reconfiguring an adaptive filter with coefficients of the equalization function to adaptively filter the transduced signal of the microphone.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
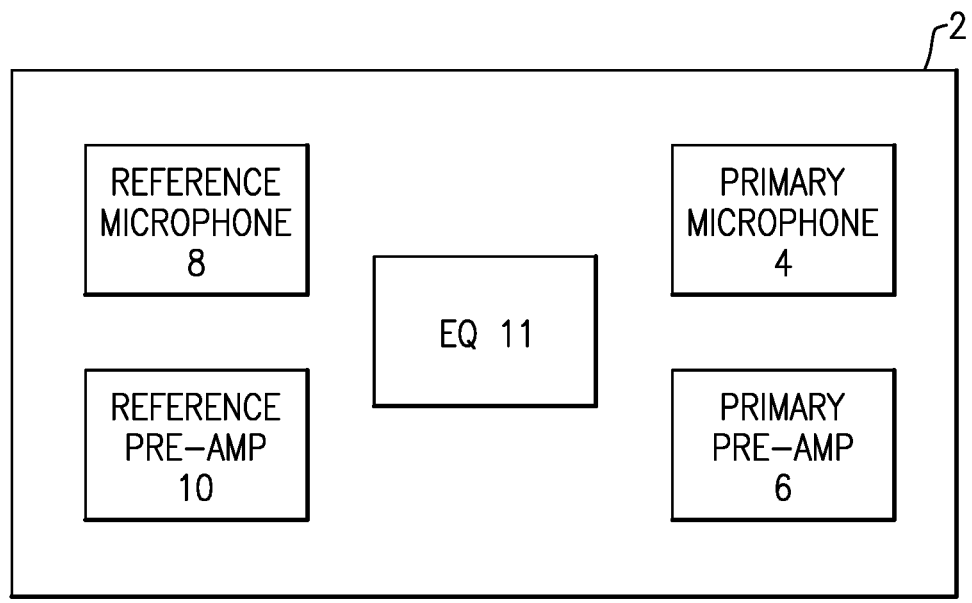
FIG. 1 is a block diagram of a microphone according to one embodiment.

Aspects and embodiments described herein are directed to frequency response equalization in MEMS transducers, such as microphones. Some of the technical issues in having microphone resonances in the audio band are high energy peaks/consumption causing damage to ears and/or electronics, unsolvable design tradeoffs of performance (e.g., sensitivity) versus resonance frequency to remove the resonance peaks from the audio band, increased group delay at resonance (e.g., delay distortion of voice and/or audio signals), and manufacturing, packaging, and other variations causing resonance frequency to be different from part to part.

To solve these technical issues, embodiments provided herein include equalization methods and electronic acoustic devices for equalizing the frequency response of a MEMS microphone including a primary MEMS microphone and a reference MEMS microphone, a packaging that encloses the primary and secondary microphones, as well as signal processing hardware (e.g., ASICs). To gain the benefits of embodiments disclosed herein, each of the primary and reference microphones are of the same type, each has a different resonance frequency, and both microphones receive a signal to be transduced at substantially the same time. In an example, by the "same type," it is understood that both the primary and reference microphones have the same theoretical frequency response to the same/common acoustic excitation. The transduced signal of the reference microphone is used to equalize the transduced signal of the primary microphone, and more particularly, to equalize the resonance frequency of the primary microphone. Examples include both microphones being MEMS microphones. However, it should be appreciated that embodiments of the present invention are not limited to sound transducers (e.g., microphones), but may be adapted to other types of transducers, such as MEMS accelerometers or pressure transducers. An equalization method is provided that includes exciting both the primary and secondary microphones with the same/common signal, carrying out spectral estimations of the transduced signals, and finding best polynomial fittings of the transfer function of the primary microphone to generate an equalization function to remove the resonance peak of the primary microphone.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

All microphones have a resonance with most microphones having a very high Q factor (i.e., the ratio of a resonator's center frequency to its bandwidth when subject to an oscillating driving force), which can be a peak of ten times over the mid band sensitivity. Many microphones are condenser-type microphones and prior solutions of dealing with the resonance peak/spike is to push the spike beyond 20 kHz where it is nearly or entirely imperceptible to human hearing. However, when the resonance peak is pushed outside the audio band, the sensitivity of the microphone may be negatively impacted by as much as 20 dB or more.

Prior solutions of improving the frequency response of microphones include adding structures to the microphone or its packaging to move the resonance peak out of the audible range, as well as calibrating the microphone at the factory. However, such solutions are not well-suited for improving the frequency response of the microphone as the frequency response changes over time due to a variety of factors including aging components and effects from the environment. For example, the resonance frequency of a microphone can change as the physical structure of the microphone changes over time due to fluctuations in temperature, humidity, etc. When the resonance frequency changes, any previous calibration will no longer be optimal and structures added to the microphone or its packaging may not eliminate the peak resonance as they had done initially.

The ideal measurement from a microphone only includes the incoming audio signal without any distortion or noise. Any noise or signal that is picked up by the microphone that is not the audio signal will corrupt the microphone's estimate of the audio signal. Embodiments herein have the benefit of improving the microphone's (or other suitable transducer or sensor) estimate of the audio signal in the presence of any incoming energy (including noise).

The disclosed embodiments overcome current limitations in the prior art by providing MEMS microphones with high sensitivity and signal-to-noise (SNR) figures without tradeoffs in the frequency response (i.e., no peaks). Equalization methods use statistical signal processing, which is agnostic of primary and reference microphones, faster, and suitable for operation in noisy environments. System-on-Chip (SoC) embodiments of MEMS microphones secure accurate acoustic excitation conditions and simpler, cheaper packaging due to shared ports and front and back cavities with less sensitivity to intrinsic MEMS manufacturing process variations. Embodiments also include System-in-Package (SiP) implementations where each microphone is made in a separate process.

FIG. 1 is a block diagram of an electronic acoustic device 2 including a primary microphone 4, a primary pre-amplifier 6, a reference microphone 8, a reference pre-amplifier 10, and an equalization module 11. In certain embodiments the equalization module 11 is a digital signal processor (DSP) or DSP controller. In other embodiments, the equalization module 11 is one of a microcontroller, an ASIC controller, or a general purpose central processing unit (CPU). The electronic acoustic device 2 includes packaging (not shown in FIG. 1) that contains each of the primary microphone 4, the primary pre-amplifier 6, the reference microphone 8, the reference pre-amplifier 10, and the equalization module 11. Examples include the electronic acoustic device 2 being implemented as a SoC or a SiP.

The primary pre-amplifier 6 is electronically coupled to the primary microphone 4 and is configured to amplify the transduced signal output by the primary microphone 4. Likewise, the reference pre-amplifier 10 is electronically coupled to the reference microphone 8 and is configured to amplify the transduced signal output by the reference microphone 8. The equalization module 11 is electronically coupled to the primary pre-amplifier 6 and the reference pre-amplifier 10 and is configured to receive and process the transduced signals from the primary microphone 4 and the reference microphone 8.

To carry out the equalization methods and techniques disclosed herein, each of the primary microphone 4 and the reference microphone 8 has a different resonance frequency and is configured to receive the same acoustic signal. In one embodiment, the resonance frequency of the reference microphone 8 is higher than the resonance frequency of the primary microphone 4. In other embodiments, the resonance frequency of the reference microphone 8 may be lower than the resonance frequency of the primary microphone 4. It is understood that the equalization methods and techniques disclosed herein are applicable to both embodiments where the reference microphone 8 has a higher resonance frequency and embodiments where the reference microphone 8 has a lower resonance frequency than the primary microphone 4.

In certain examples, the primary microphone 4 has a lower resonance frequency than the reference microphone 8, and also has a higher sensitivity than the reference microphone 8. In this case, the resonance in the primary microphone can negatively impact the usability of the primary microphone's bandwidth. The frequency responses of the primary microphone 4 and the reference microphone 8 after their respective first resonance peaks can be more complex than before their respective first resonance peaks, with steep drops and raises in sensitivity and higher-order resonance peaks. In this scenario, any measurement of the acoustic and environmental conditions attempted with a lower-frequency reference microphone would be done in a region of its frequency response with many features and a non-flat sensitivity response, which makes the reference microphone less suitable for serving as a 'clean' reference when compared to a reference microphone with a lower resonance frequency response. Accordingly, in certain examples, a reference microphone having a higher first peak in its frequency response than a primary microphone is more desirable.

Figure 2A:
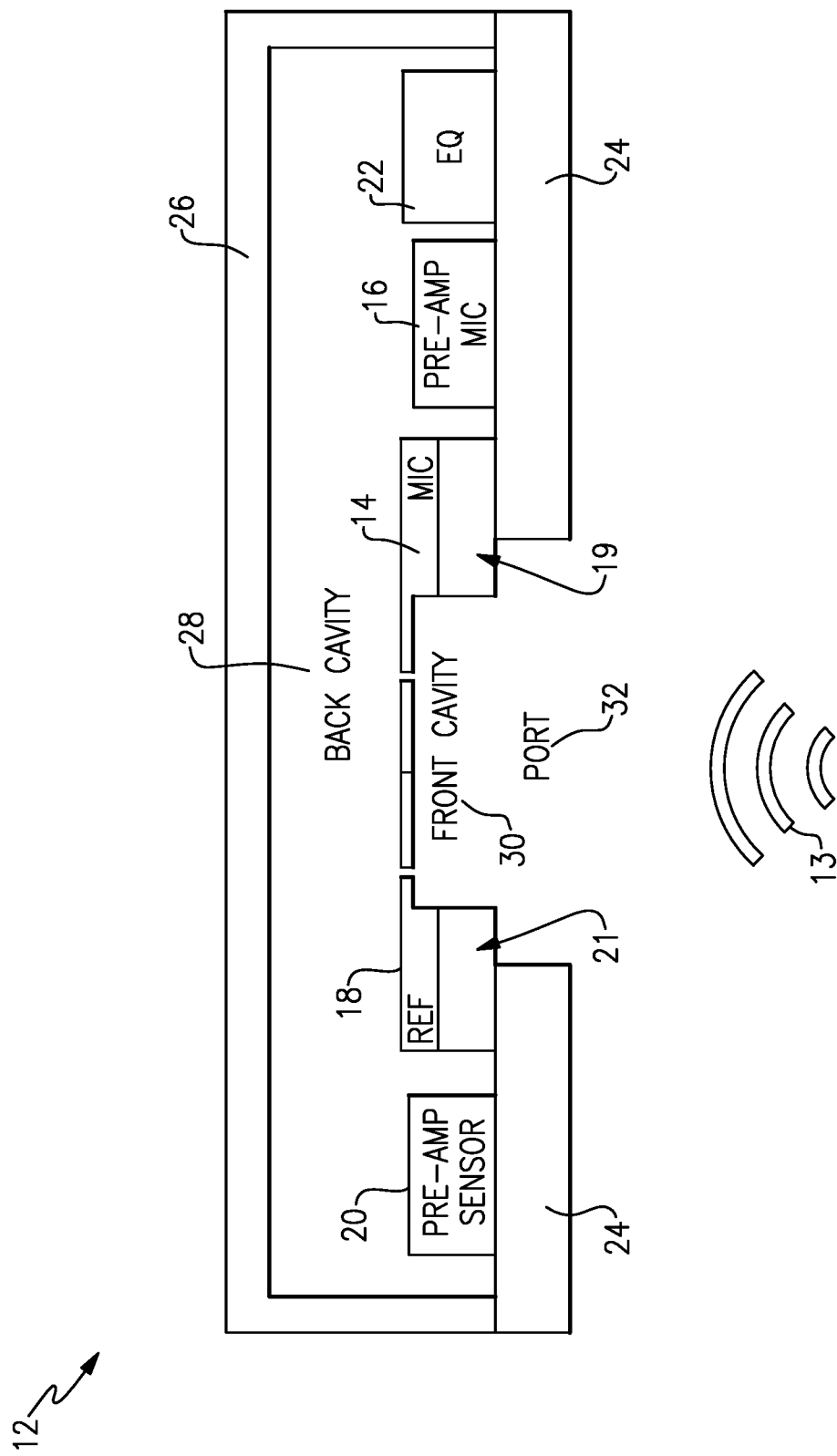
FIG. 2A is a cross-section of a microphone according to another embodiment.

FIG. 2A is a cross-section of an electronic acoustic device 12 including a primary MEMS microphone 14, a primary microphone pre-amplifier 16, a reference MEMS microphone 18, a reference pre-amplifier 20, an equalization module 22, a substrate 24, packaging 26, a back cavity 28, a front cavity 30, and a port 32. In certain embodiments, the substrate 24 is made of silicon. In other embodiments, the substrate 24 is a printed circuit board (PCB). The primary microphone 14 is supported by a support 19, which is, in some examples, made of silicon and coupled to the substrate 24, which is also made of silicon. Similarly, the reference microphone 18 is supported by a support 21, which is, in some examples, made of silicon and coupled to the substrate 24, which is also made of silicon. In an example, the primary microphone 14 and the reference microphone 18 are built on a silicon die singulated from a silicon wafer. In other examples, all of the primary MEMS microphone 14, the primary microphone pre-amplifier 16, the reference MEMS microphone 18, the reference pre-amplifier 20, and the equalization module 22 are produced as chips that are mounted on the substrate 24.

The back cavity 28 is defined by a volume contained within the packaging 26 and between the substrate 24 and the rest of the interior components. For purposes of brevity, relevant discussion of similar components (e.g., the pre-amplifier 16 and the pre-amplifier 6 from FIG. 1) is applicable to FIG. 2A and subsequently described embodiments and will not be repeated.

The electronic acoustic device 12 is configured to receive an acoustic signal 13 at the port 32, which is then channeled into the front cavity 30, and then channeled into the back cavity 28 such that the acoustic signal reflects onto both the reference microphone 18 and the primary microphone 14 substantially simultaneously. As used herein, the phrase "substantially simultaneously" is understood to mean ideally at the same time. In practical terms, it is near impossible for an acoustic wave to reach two co-located and co-planar sensors at exactly the same time (i.e., simultaneously). Hence, the electronic acoustic device 12 is designed to channel the incoming acoustic signal onto both microphones at as near the exact same time as possible, or substantially simultaneously. By ensuring that both microphones encounter and transduce the incoming signal at substantially the same time, the transduced signal from the reference microphone 18 can be used to remove the resonance peak of the primary microphone 14.

The back cavity 28 supports the operation and performance of the primary microphone 14 and the reference microphone 18 in several ways. First, the back cavity 28 finalizes the frequency response—the size of the back cavity 28 ultimately defines the resonance frequency of the primary microphone 14 and the reference microphone 18. Second and consequently, the back cavity 28 also determines other key performance parameters as the sensitivity and the noise/SNR of each microphone.

Each of the components depicted in FIG. 2A is built within the same SoC manufacturing process where both microphones 14, 18 use the same process layers while having different sensitivities and frequencies. The electronic acoustic device 12 can contain one or more ASICs for amplification, signal conditioning, and the equalization module 22.

As shown in FIG. 2A, the electronic acoustic device 12 includes two SoC devices: the reference microphone 18 and the primary microphone 14. However, the electronic acoustic device can include more than two SoC devices (not shown). For example, in addition to the reference microphone 18 and the primary microphone 14, an additional microphone may be provided.

Figure 2B:
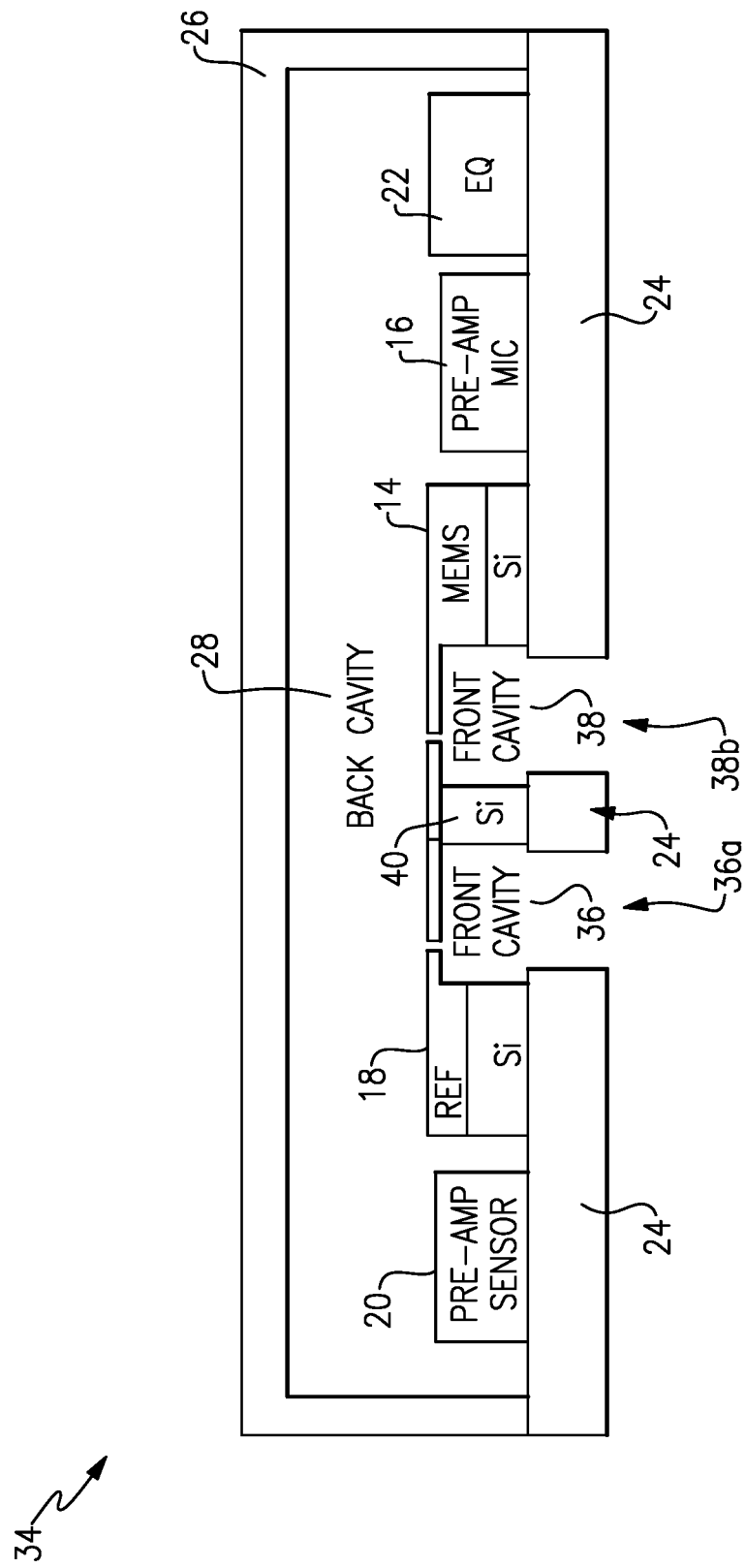
FIG. 2B is a cross-section of a microphone according to another embodiment.

FIG. 2B is a cross-section of an electronic acoustic device 34 that has a first front cavity 36 and a second front cavity 38. A first port 36a is provided near the first front cavity 36 to channel acoustic energy into the first front cavity 36. A second port 38b is provided near the second front cavity 38 to channel the acoustic energy into the second front cavity 38. Description of identically numbered elements in common with FIG. 2A will be omitted for brevity. In some examples, each of the primary microphone 14 and reference microphone 18 is constructed from a piezoelectric material formed atop a silicon substrate. As shown in FIG. 2B, the electronic acoustic device 34 includes silicon material forming layers that couple the microphones 14, 18 to the base substrate 24 which may be a silicon substrate or a printed circuit board (PCB) substrate. In an example, 'coupled' means connected, touching, and/or supporting. A silicon divider 40 is also utilized to separate the first cavity 36 from the second cavity 38. Providing a separate front cavity for each microphone assists in acoustically isolating the primary microphone 14 from the reference microphone 18.

Figure 3A:
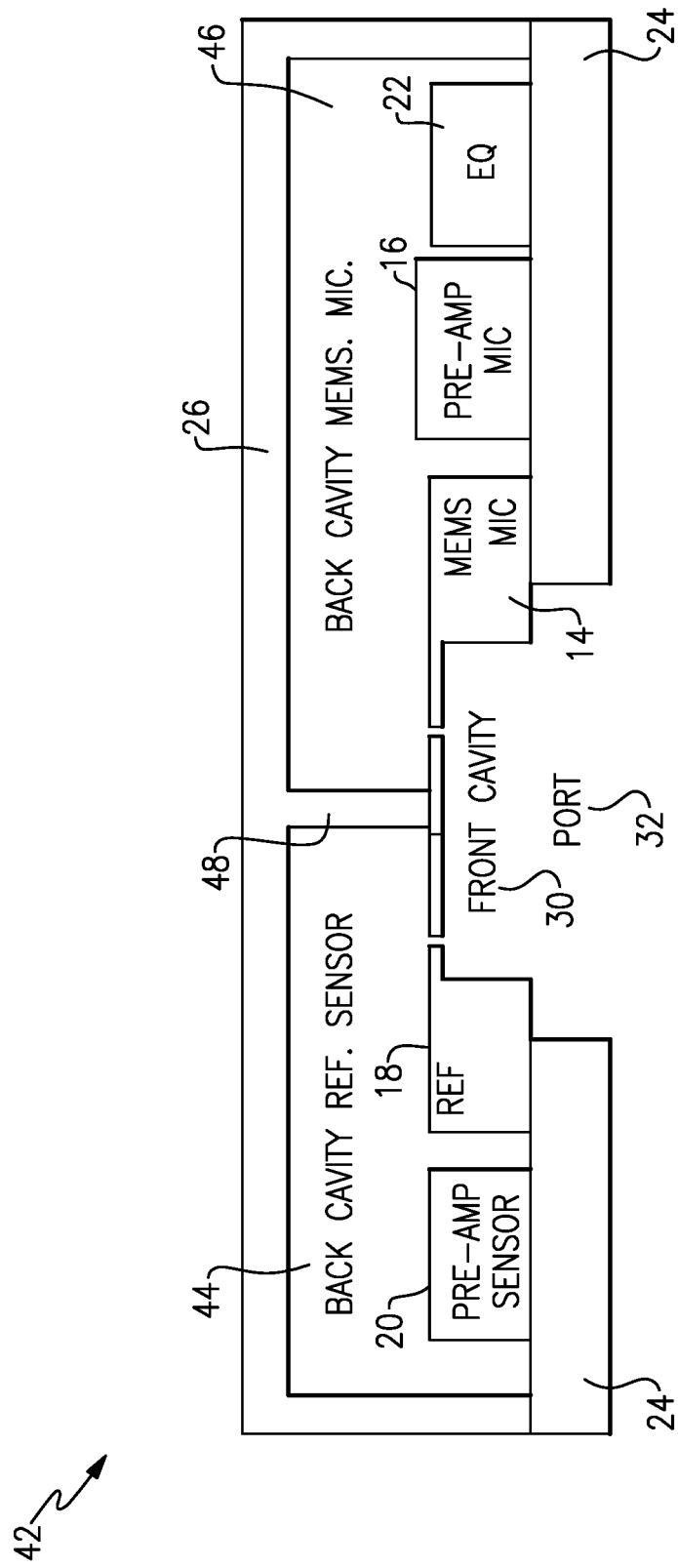
FIG. 3A is a cross-section of a microphone according to another embodiment.

FIG. 3A is a cross-section of an electronic acoustic device 42 that has a first back cavity 44 and a second back cavity 46 separated by a divider 48. In some examples the divider 48 is made of silicon. In other examples the divider is made of the same material as the packaging and is part of the packaging 26. Description of identically numbered elements in common with FIGS. 2A and 2B will be omitted for brevity. Providing a separate back cavity for each microphone assists in acoustically isolating the primary microphone 14 from the reference microphone 18.

Figure 3B:
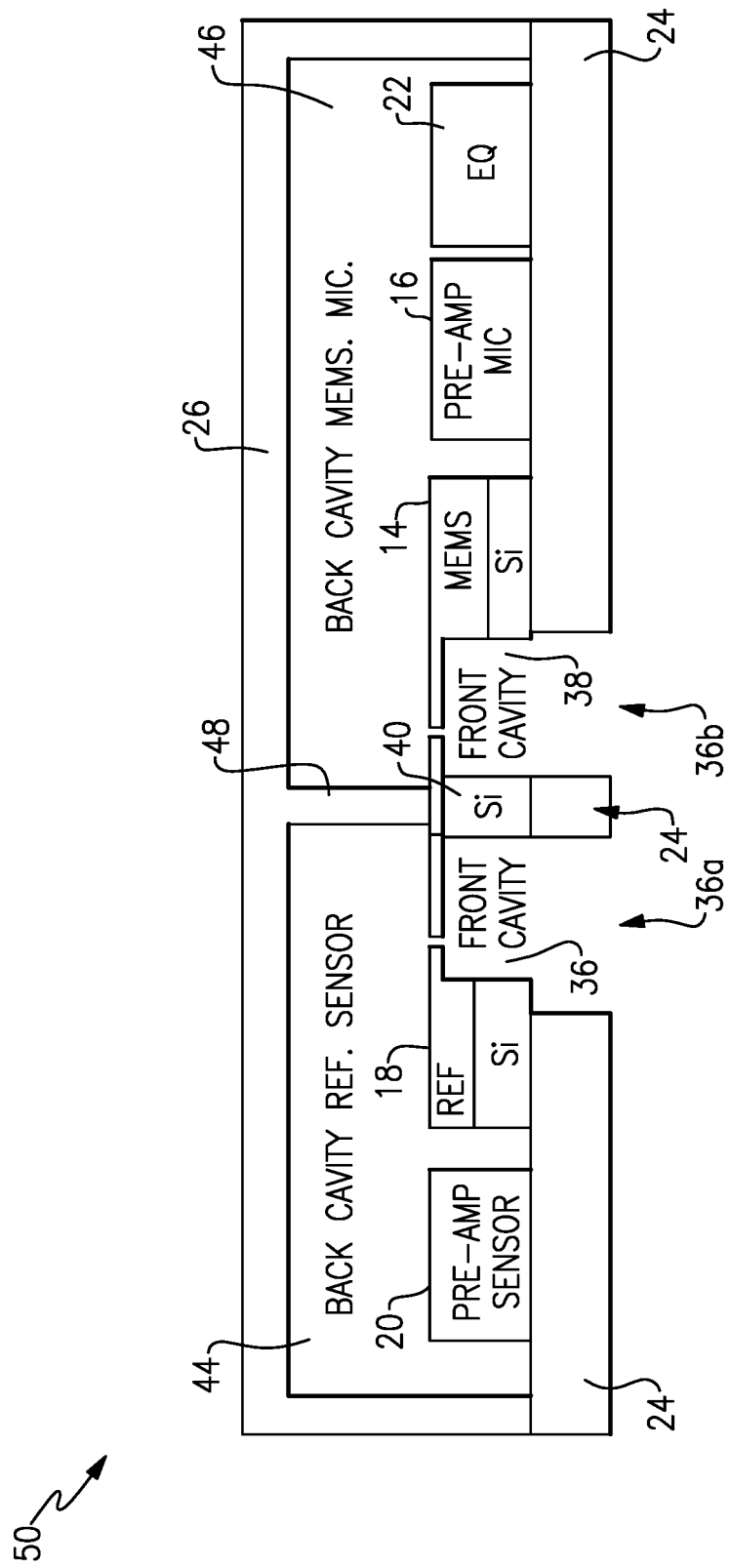
FIG. 3B is a cross-section of a microphone according to another embodiment.

FIG. 3B is a cross-section of an electronic acoustic device 50 that has the first back cavity 44 and the second back cavity 46 separated by the divider 48 as well as the first front cavity 36 and the second front cavity 38 separated by the divider 40. Description of identically numbered elements in common with FIGS. 2A and 2B will be omitted for brevity. Providing both separate back cavities for each microphone as well as separate front cavities further assists in acoustically isolating the primary microphone 14 from the reference microphone 18.

Figure 4:
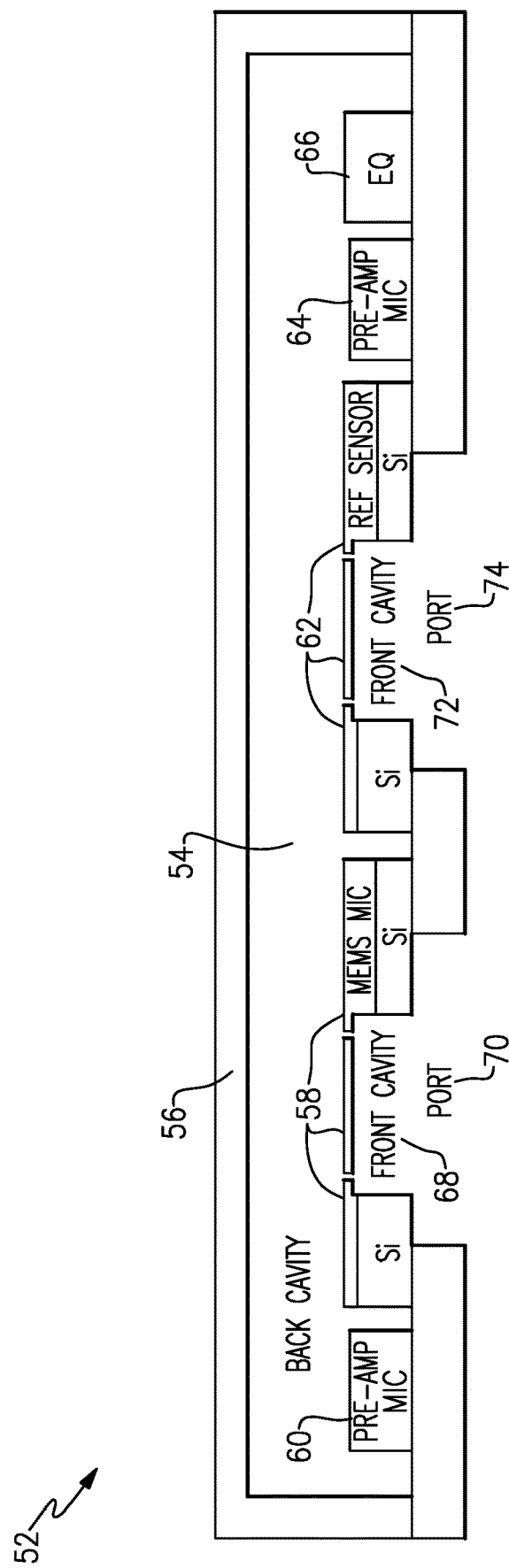
FIG. 4 is a cross-section of a microphone according to another embodiment.

FIG. 4 is a cross-section of an electronic acoustic device 52 with a single back cavity 54 that is surrounded by packaging 56. The electronic acoustic device 52 includes a primary MEMS microphone 58 and primary pre-amplifier 60, a reference microphone 62 and reference pre-amplifier 64, and an equalization module 66. While FIG. 4 depicts the primary MEMS microphone 58 and the reference microphone 62 as being diaphragm type piezoelectric microphones, in other embodiments, the electronic acoustic device can alternatively include cantilevered piezoelectric microphones. Further, the type of microphones utilized in the electronic acoustic device 52 is not limited to diaphragm and cantilever type piezoelectric microphones. Each microphone in the electronic acoustic device 52 is provided with a separate front cavity and port. The primary microphone 58 is provided with a front cavity 68 and a port 70. Similar to embodiments described above, the port 70 is configured to channel an incoming acoustic wave into the front cavity 68 to interact with the primary microphone 58. Likewise, the reference microphone 62 is provided with a front cavity 72 and a port 74, where the port 74 is configured to direct the same incoming acoustic wave into the front cavity 72 to interact with the reference microphone 62.

In certain embodiments, each of the primary microphone 58 and the reference microphone 62 may be built within a different manufacturing process and can be provided in two different chips, respectively, that are integrated at the packaging level. In one embodiment, this integration is part of constructing the electronic acoustic device 52 as a SiP. In an example of the electronic acoustic device 52, two or more ASICs are included for amplification—at least one for the primary microphone 58 and a second ASIC for the reference microphone 62, signal conditioning, and the equalization module 66. The packaging structure can be similar for both microphones, although in certain embodiments, modifications may be needed to accommodate their respective ASIC chips and design particularities.

Figure 5:
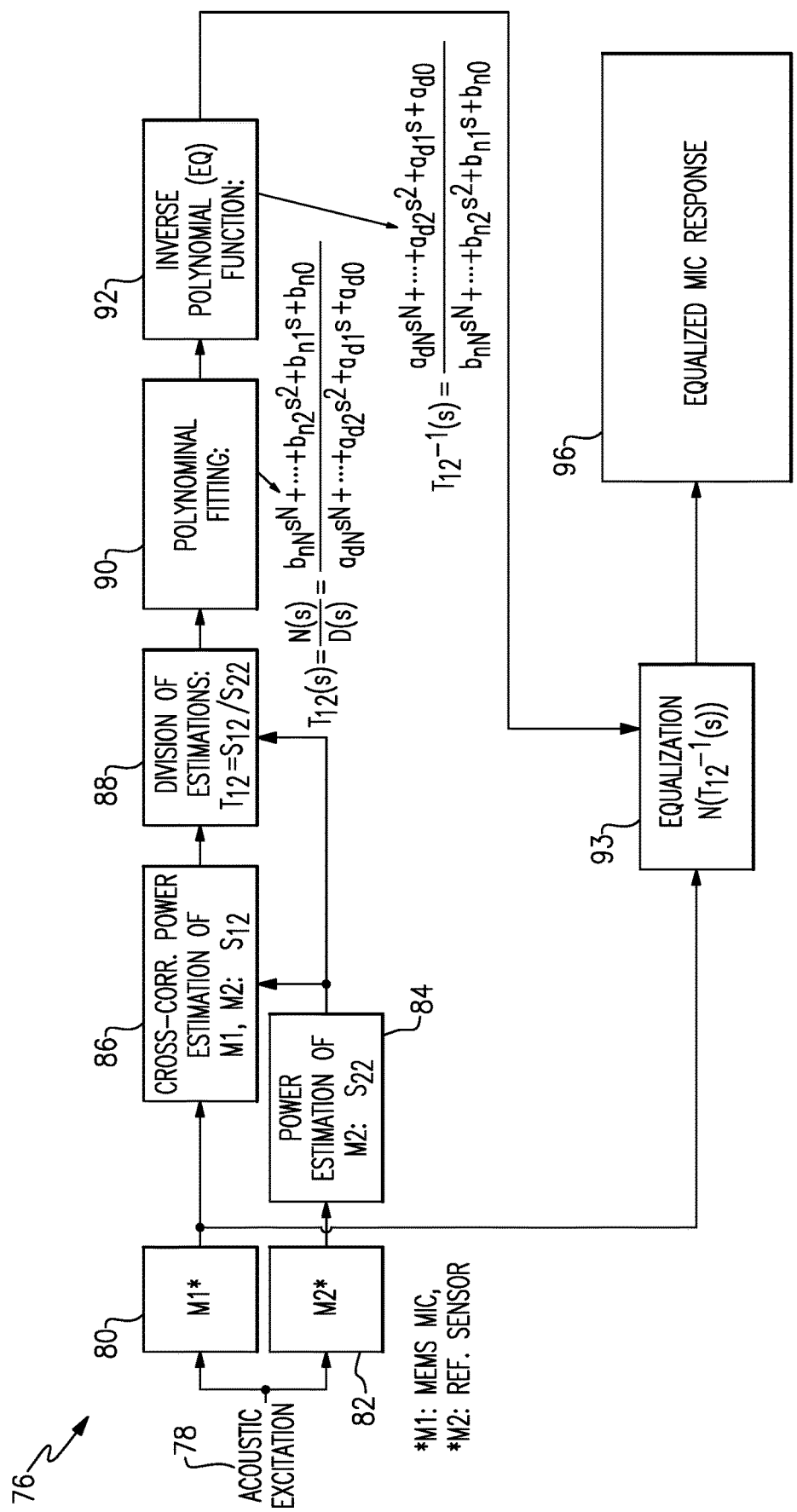
FIG. 5 is a functional block diagram of an equalization method according to another embodiment.

Each of the electronic acoustic devices disclosed herein, including the electronic acoustic devices 2, 12, 34, 42, 50, and 52 utilizes an equalization method for removing the resonance peak in the frequency response of a MEMS microphone. FIG. 5 illustrates such an acoustic equalization method 76.

The equalization method 76 begins with an acoustic wave or excitation 78. The acoustic excitation is passed to at least two MEMS microphones as a common acoustic excitation. As an example and shown in FIG. 5, the at least two microphones include a primary MEMS microphone 80 and a reference MEMS microphone 82 (although the described equalization method is applicable to each of the electronic acoustic devices described herein).

In an Act 84 of the method 76, the transduced signal from the reference microphone 82, which in this example has a higher resonance frequency than the primary microphone 80, is processed to estimate the power spectrum of the transduced signal. In at least one embodiment, the power spectrum is obtained by calculating the Fast Fourier Transform (FFT) of the transduced signal to produce a spectrum estimate $S_{22}$. It is understood that other techniques may be applied to estimate a power spectrum of a transduced signal. For example, Welch estimation, or other techniques that do not use the FFT, such as the Goertzel filter algorithm, may be applied to estimate the power spectrum of the transduced signal. In other examples, Kalman filters may utilized in place of the FFT to extract a transfer function estimate of the microphone(s).

In an Act 86 of the method 76, the cross-correlation $R_{12}$ of time-domain samples produced from the transduced signals of the primary microphone 80 and the reference microphone 82 is obtained. Subsequently, the frequency-domain power spectrum estimate $S_{12}$ of the cross-correlation $R_{12}$ is calculated.

In an Act 88, the power spectrum estimate $S_{12}$ of the cross-correlation Ru is divided by the power spectrum estimate $S_{22}$ of the reference sensor to produce a transfer function estimate $T_{12}$ of the primary microphone 80.

In an Act 90, a polynomial of order N is fit to the quotient of the transfer function estimate $T_{12}$, where N≥2.

Once the polynomial is obtained, the method 76 proceeds to an Act 92, where the inverse of the polynomial $T_{12}^{-1}$ is calculated as an equalization function for the primary microphone 80. Certain embodiments utilize a least-squares fit of coefficients to the frequency points of the transfer function estimate $T_{12}$ in the Act 92. In an example, the order N is 3 and at least four frequency points are used in order for there to be a sufficient rank to solve for the curve.

In an Act 93, the frequency response of the primary microphone 80 is filtered with the inverse polynomial $T_{12}^{-1}$ to produce an equalized frequency response in the primary microphone 80 at 96. In the Act 93, the coefficients obtained by the Act 92 are passed to the Act 93, and the Act 93 includes a fetch procedure to fetch the coefficients and re-program/update the filter function N with such coefficients. The Act 93 therefore provides an adaptive filter that is reconfigurable using the coefficients of the equalization function N. The adaptive filter may then continuously process and filter the transduced signal produced by the primary microphone.

As a consequence of performing the equalization method 76, the impact of noise on the estimation of the transfer function of the primary microphone 80 may be reduced. In certain examples, the power spectrum estimation algorithms used in the equalization method 76 use accumulation and averaging of the FFT of the signal samples, which is equivalent to improving the immunity to noise—as noise variance is reduced with averaging, and therefore allows extraction of a 'cleaner' transfer function.

Figure 6:
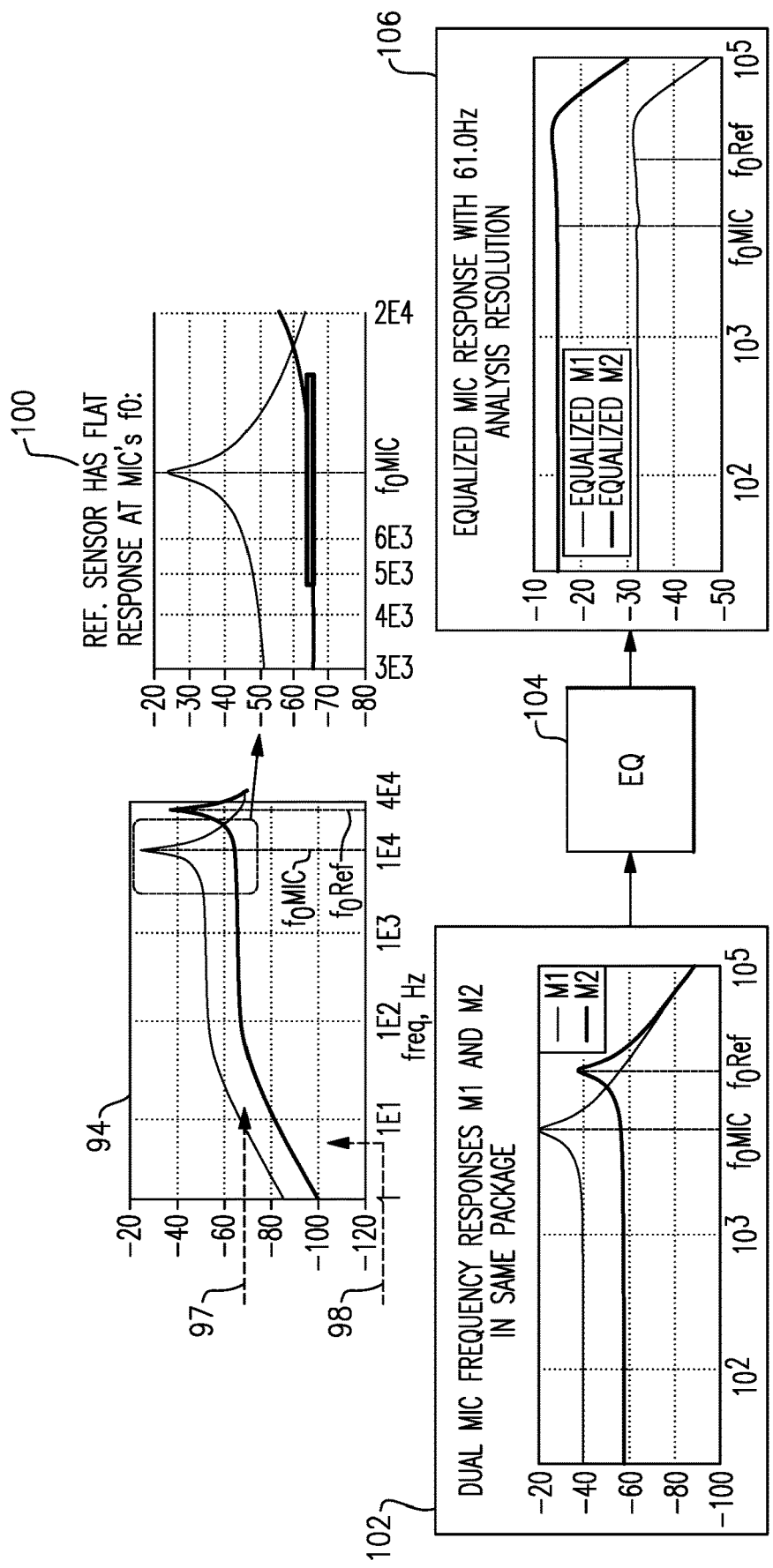
FIG. 6 is a set of frequency response graphs and a functional block diagram according to another embodiment.

FIG. 6 shows a set of frequency response graphs 94, 100, 102, 106 and a functional block diagram 104. Before equalization (e.g., applying the method 76), a frequency response 97 of a primary microphone and a frequency response 98 of a reference microphone are presented in a first frequency response graph 94. The lowest resonant frequency or fundamental frequency $f_0$ is represented by a peak in each frequency response in the graph 94. Of note, as shown in the graph 100, the reference microphone has a substantially flat frequency response at the primary microphone's fundamental frequency. The graph 94 and the graph 100 represent frequency responses without equalization. The graph 100 is a zoomed-in view of the first frequency response graph 94. A condition for the frequency response of the reference microphone therefore, may be that the frequency response is monotonic around the reference microphone's resonance (i.e., no ups and downs in the vicinity of the resonance of the primary microphone, but with the possibility of a sloped (increasing or decreasing) sensitivity.

The graph 102 is equivalent to the first frequency response graph 94 and the graph 100. The graph 102 represents the frequency responses of two microphones (e.g., the primary microphone 80 and the reference microphone 82) in the same package, which are then processed by an equalization module 104 (e.g., having the same or similar functionality as the equalization module 11 in FIG. 1) to produce an equalized frequency response shown in the graph 106, where both frequency responses are roughly flat at the primary microphone's fundamental frequency.

Figure 7A:
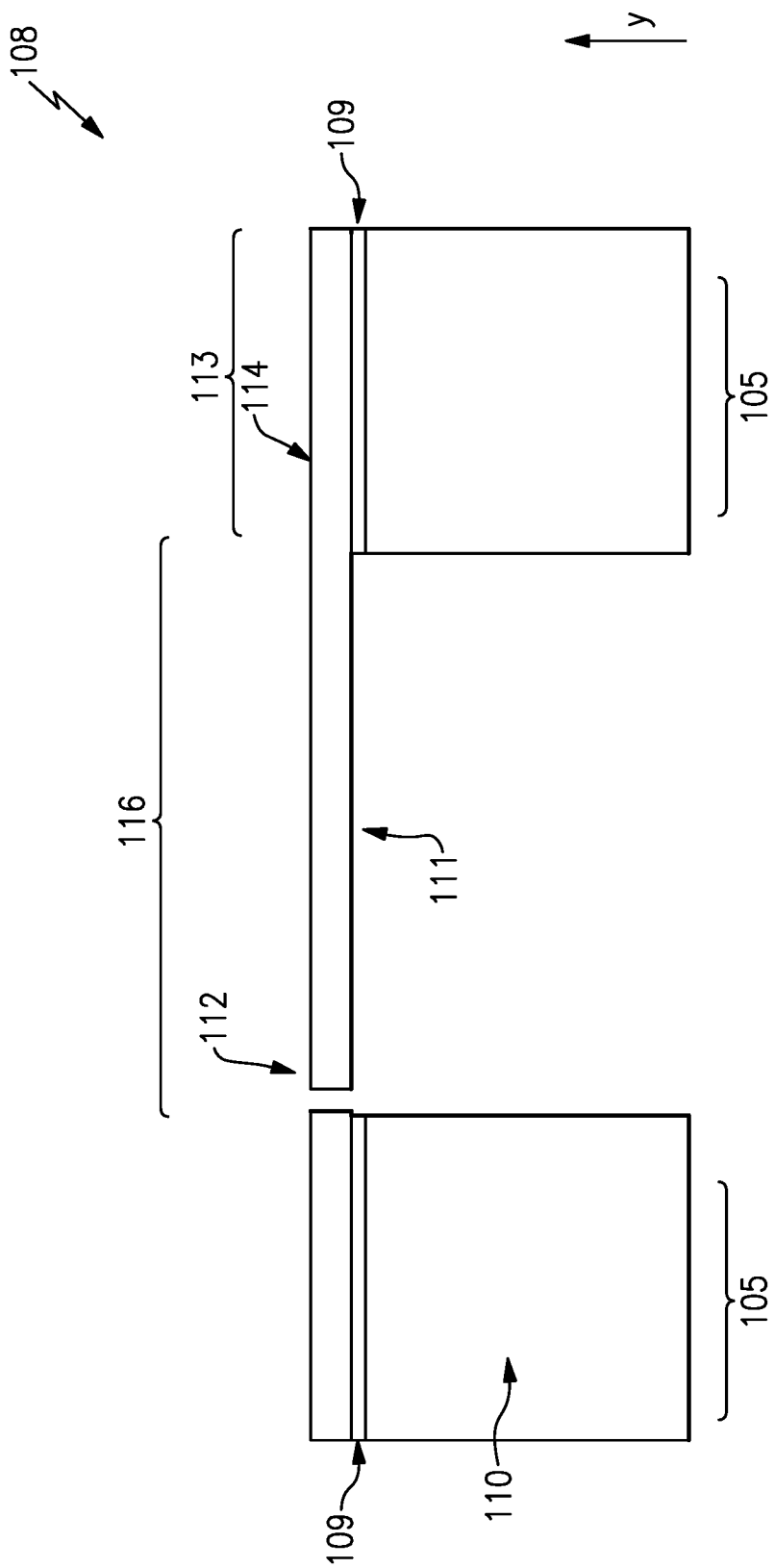
FIG. 7A is a cross sectional view of a microelectromechanical systems microphone with a flat cantilevered beam according to another embodiment.

FIG. 7A shows a cross sectional view of one implementation of a piezoelectric microelectromechanical systems (MEMS) microphone 108. The microphone 108 is a piezoelectric MEMS cantilever microphone usable in any of the electronic acoustic devices 2, 12, 34, 42, 50, 52 described herein. The microphone 108 comprises a substrate 110. The substrate 110 is optionally made of silicon. The substrate 110 has two side walls 105, arranged such that they extend perpendicular to the length of the cantilever. Two further end walls (not shown) complete the cavity on opposite sides, such that they meet the side walls at right angles, and a further structure, described in relation to FIG. 7B later, may be on the underside of the cavity. The walls are preferably around 108-500 micrometers thick. A piezoelectric film layer 111 forms a cantilevered beam 116 over the cavity. At least one of the side walls 105 defines an anchor region 113. The anchor region is preferably around 108-500 micrometers thick. The anchor region 113 is the area where a piezoelectric film layer 111 is coupled to and supported by one of the side walls. The microphone 108 optionally comprises an insulation layer 109 disposed on a surface of the substrate 110. The insulation layer is optionally silicon dioxide. The piezoelectric film layer 111 is supported by the substrate 110 at the anchor region 113, such that the piezoelectric film layer 111 is cantilevered and extends between a fixed end 114 and a free end 112. At least one electrode (not shown) is arranged over the piezoelectric film layer. Preferably, the arrangement comprises multiple electrodes arranged over and under the piezoelectric film layer and, in some arrangements, between such layers. Together the piezoelectric film layer(s) and electrode(s) form a cantilevered beam 116. It will be appreciated that although the beam is illustrated as having a rectangular shape, other shapes may be used. The microphone 108 comprises at least one electrode which may be disposed over the piezoelectric film layer 111, such that the electrode is located on the cavity side of the piezoelectric layer, or such that the electrode is located on the other side of the piezoelectric layer away from the cavity. The electrode is optionally positioned adjacent the anchor region 113. The insulation layer 109 provides insulation between an electrode, disposed on the cavity side of the piezoelectric film layer, and the silicon substrate 110.

Figure 7B:
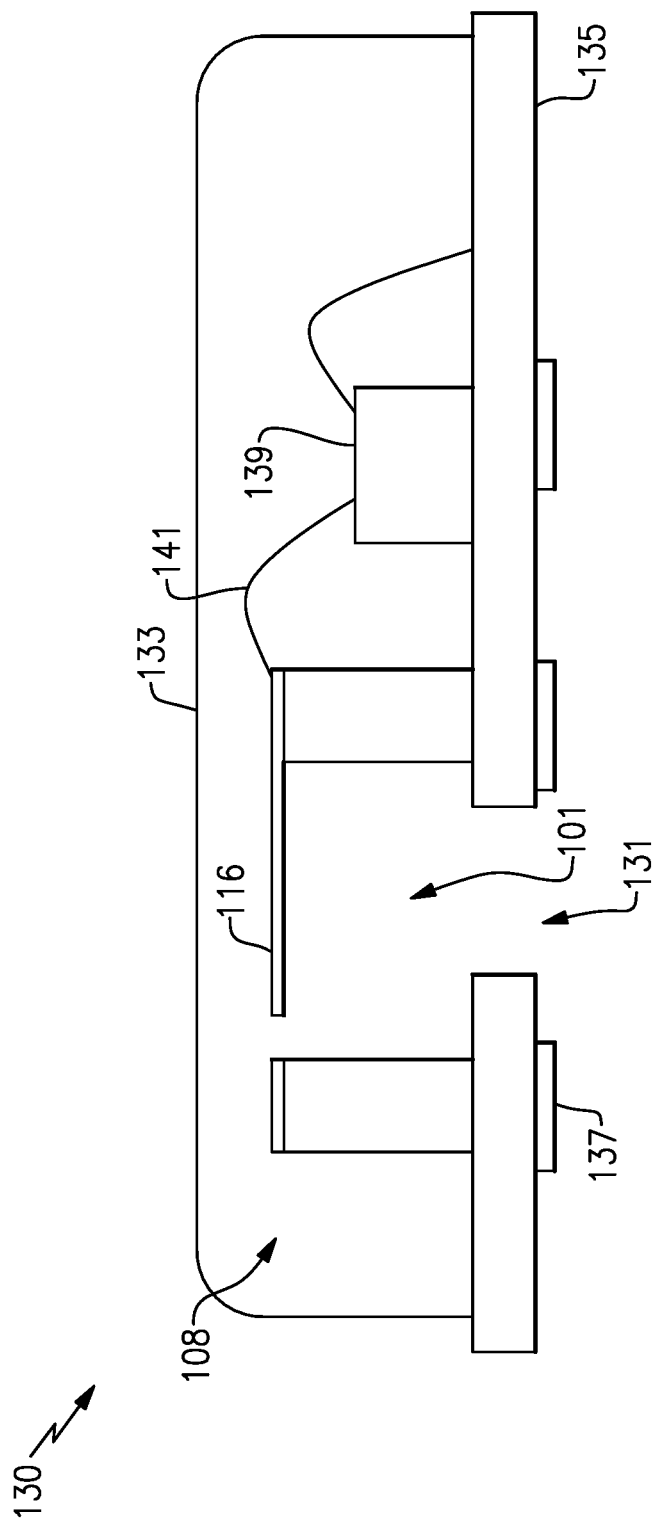
FIG. 7B is a cross sectional view of a microelectromechanical systems microphone arrangement according to another embodiment.

FIG. 7B illustrates a cross sectional view of another microphone arrangement 130. It will be appreciated that this is an example embodiment for illustrative purposes, and the microphone can be included in a variety of different arrangements. As illustrated, the microphone 108 of FIG. 7A is located within a cap 133. The cap may be flexible or rigid, and may be any suitable material such as a metallic material. The cap creates a seal with a substrate 135 (for example a printed circuit board), such that air only flows into and out of the arrangement via a sound inlet 131. The substrate 135 may be any suitable material. The cap 133 also mitigates electromagnetic interference. Sound waves enter the arrangement, causing the cantilevered beam 116 to bend and produce voltage due to the piezoelectric effect, as described herein. The arrangement 130 comprises at least one solder pad 137 such that the microphone arrangement may be soldered to external devices, not shown here. The microphone arrangement further comprises an application specific integrated circuit chip/die ("ASIC") 139. The MEMS microphone is electrically connected by wire bonding 141. Although not shown, it will be appreciated that the wire bonding may be connected to the one or more electrodes of the microphone, as described herein.

It will be noted that FIG. 7B is a cross-sectional view of the arrangement 130, such that the one or more solder pads 137, substrate 135, MEMS microphone 108, ASIC 139, and cap 133 extend into the page such that they are three-dimensional, as described in relation to other embodiments disclosed herein.

Figure 8:
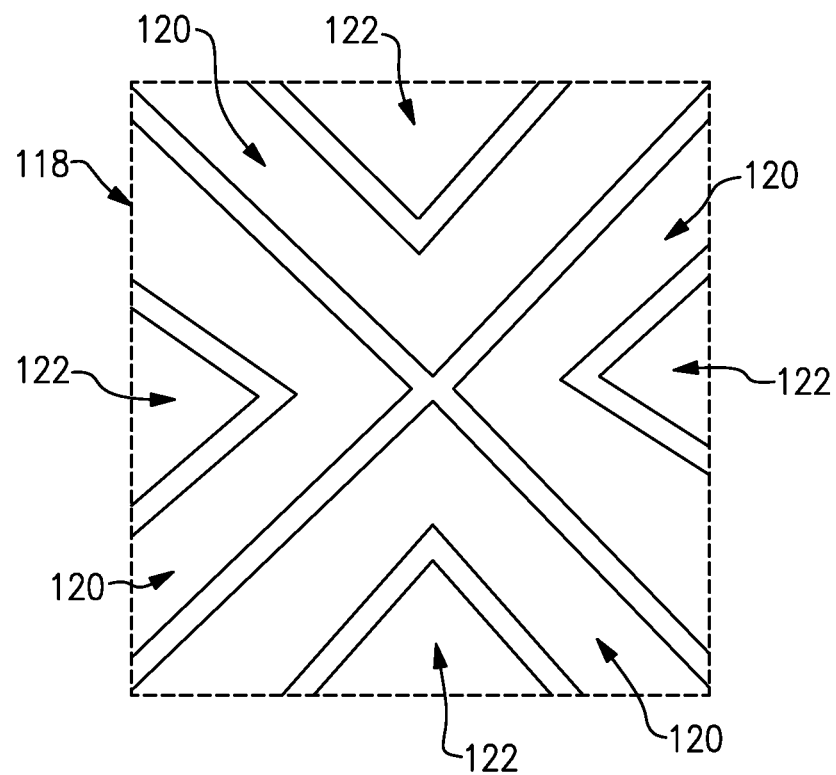
FIG. 8 is a layout of a section of a cantilever beam piezoelectric microphone according to another embodiment.

FIG. 8 shows a layout of a section 108 of a cantilever beam piezoelectric microphone including a first set of cantilever beams 120 and a second set of cantilever beams 122. The first set of beams 120 may correspond to a primary microphone (e.g., the primary microphone 58) and the second set of beams 122 may correspond to a reference microphone (e.g., the reference microphone 62). Each of the triangular tabs formed by the beams 120, 122 and the material therebetween is a piezoelectric material. When the piezoelectric material moves or flexes due to sound waves encountering the material, a voltage is modified corresponding to the amount of movement or flexing. More specifically, the triangular portions contain metal layers that create charges, which are picked up by electrodes. In some examples, all four triangular portions of the first set of beams 120 are tied (i.e., electrically connected) together to act as one microphone and similarly, all four triangular portions of the second set of beams 122 are tied together to act as one microphone. In other examples, one or more individual triangular portions is separately coupled to an equalization module to act as distinct microphones, thereby including more than two microphones according to certain embodiments. For example, an electronic acoustic device may include three microphones, with two of the three microphones made from at least two of the first set of beams 120. The length and/or size of each cantilever beam may be modified to produce a different desired resonant frequency. In an example, the length of a beam is increased to lower its resonant frequency.

Figure 9:
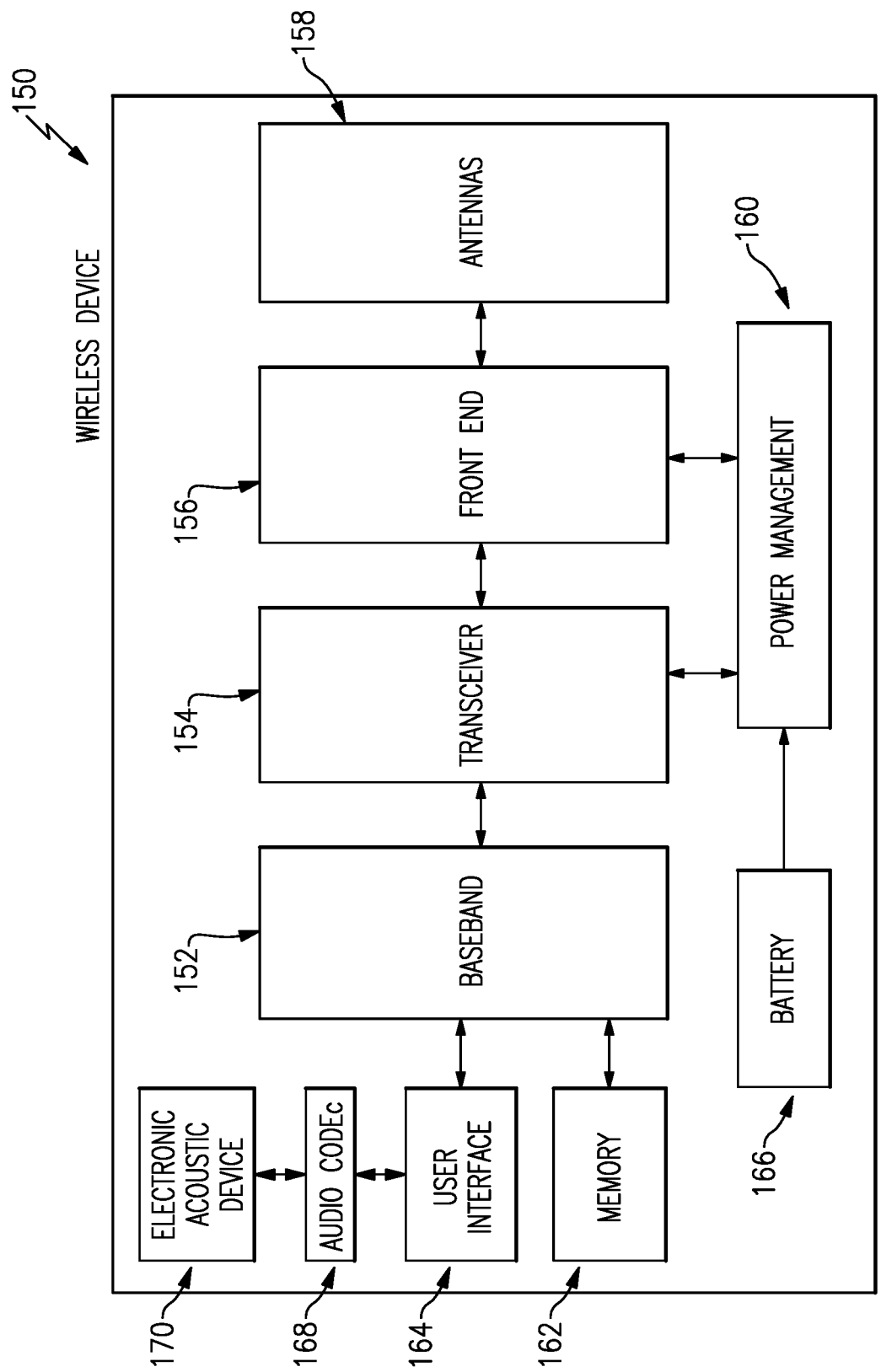
FIG. 9 is a schematic diagram of a wireless device comprising a piezoelectric microelectromechanical systems microphone according to another embodiment.

FIG. 9 is a schematic diagram of one embodiment of a wireless device 150. The wireless device 150 can be, for example but not limited to, a portable telecommunication device such as, a mobile cellular-type telephone. The wireless device 150 includes an electronic acoustic device 170 as described herein in relation to FIGS. 1-6, and may include one or more of a baseband system 152, a transceiver 154, a front end system 156, one or more antennas 158, a power management system 160, a memory 162, a user interface 164, a battery 166, and an audio codec 168. The electronic acoustic device 170 may supply signals to the audio codec 168 which may encode analog audio as digital signals or decode digital signals to analog. The audio codec 168 may transmit the signals to a user interface 164. The user interface 164 transmits signals to the baseband system 152. The transceiver 154 generates RF signals for transmission and processes incoming RF signals received from the antennas.

The transceiver 154 aids in conditioning signals transmitted to and/or received from the antennas 158.

The antennas 158 can include antennas used for a wide variety of types of communications. For example, the antennas 158 can include antennas 158 for transmitting and/or receiving signals associated with a wide variety of frequencies and communications standards.

The baseband system 152 is coupled to the user interface to facilitate processing of various user input and output, such as voice and data. The baseband system 152 provides the transceiver 154 with digital representations of transmit signals, which the transceiver 154 processes to generate RF signals for transmission. The baseband system 152 also processes digital representations of received signals provided by the transceiver 154. As shown in FIG. 9, the baseband system 152 is coupled to the memory 162 to facilitate operation of the wireless device 150.

The memory 162 can be used for a wide variety of purposes, such as storing data and/or instructions to facilitate the operation of the wireless device and/or to provide storage of user information.

The power management system 160 provides a number of power management functions of the wireless device.

The power management system 160 receives a battery voltage from the battery 166. The battery 166 can be any suitable battery for use in the wireless device, including, for example, a lithium-ion battery.

Embodiments provided herein are applicable to both diaphragm and cantilever-based microphones, although other geometries may be more suitable for particular applications (e.g., bridges/clamped-clamped beams). One of ordinary skill in the art would understand how to apply the principles and techniques disclosed herein to other types of microphones beyond diaphragm and cantilever microphones.

While embodiments herein are described with reference to MEMS microphones, it is understood that the principles and techniques described herein are applicable to other types of transducers. For example, embodiments herein may be adapted and used in the equalization of the frequency response of pressure sensors, force sensors, and imaging sensors (where a common excitation signal is substituted for the common acoustic wave described above. An advantage of the devices, systems and methods described herein is that the provided solution is applicable to a wide array of sensors and transducers, particularly when there is little to no control over what the incoming stimulus may be. For example, unlike pink noise generated in a lab to calibrate a MEMS microphone, MEMS microphones in the real world often fall out of calibration and/or never encounter the exact type of noise simulated in a lab. By deliberately using a reference transducer with a higher or lower frequency response than a primary transducer, the techniques provided herein enable equalization of the frequency response of the primary transducer while keeping the resonance frequency in band for the primary transducer.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An electronic acoustic device comprising:
a microphone having a frequency response including a resonance frequency;
a reference microphone having a frequency response including a resonance frequency, the microphone and the reference microphone configured to substantially simultaneously receive a common acoustic signal and to produce a transduced signal of the microphone and a transduced signal of the reference microphone, the resonance frequency of the reference microphone being different than the resonance frequency of the microphone; and
an equalization module configured to equalize the frequency response of the microphone based on the transduced signal of the microphone and the transduced signal of the reference microphone.

2. The electronic acoustic device of claim 1 wherein a sensitivity of the microphone is higher than a sensitivity of the reference microphone.

3. The electronic acoustic device of claim 1 wherein each of the microphone and the reference microphone is a microelectromechanical system (MEMS) microphone.

4. The electronic acoustic device of claim 1 wherein the equalization module is further configured to equalize the frequency response of the microphone by filtering the frequency response of the microphone with an equalization function, the equalization function based on the transduced signal of the reference microphone being produced responsive to the reference microphone receiving the common acoustic signal.

5. The electronic acoustic device of claim 1 wherein the equalization module is further configured to equalize the frequency response of the microphone by:
estimating a power spectrum of the transduced signal of the reference microphone;
calculating a cross-correlation of time-domain samples of the transduced signal of the microphone and the transduced signal of the reference microphone;
calculating a frequency-domain power spectrum estimate of the cross-correlation; and
dividing the frequency-domain power spectrum estimate of the transduced signal of the cross-correlation by the power spectrum estimate of the reference microphone to produce a transfer function of the microphone.

6. The electronic acoustic device of claim 5 wherein the equalization module is further configured to equalize the frequency response of the microphone by:
determining a fitting polynomial of order N of the transfer function, where $N \geq 2$; and
determining an equalization function of the microphone by calculating an inverse of the fitting polynomial.

7. The electronic acoustic device of claim 1 further comprising a packaging system that encloses the microphone, the reference microphone, and the equalization module.

8. The electronic acoustic device of claim 7 further comprising at least one back-side cavity defined by a volume between the packaging system, the microphone, and the reference microphone.

9. The electronic acoustic device of claim 8 wherein the at least one back-side cavity includes a first back-side cavity and a second back-side cavity, the first back-side cavity being acoustically isolated from the second back-side cavity.

10. The electronic acoustic device of claim 1 further comprising:
at least one port configured to receive the common acoustic signal; and
at least one front cavity configured to permit the common acoustic signal to substantially simultaneously reach the microphone and the reference microphone through the at least one port.

11. The electronic acoustic device of claim 10 wherein the at least one port comprises a first port and a second port, and the at least one front cavity comprises a first front cavity and a second front cavity, the first port and the second port configured to receive the common acoustic signal substantially simultaneously, the first front cavity configured to permit the common acoustic signal to reach the microphone through the first port and second front cavity configured to permit the common acoustic signal to reach the reference microphone through the second port.

12. The electronic acoustic device of claim 1 wherein the microphone and the reference microphone are co-located and co-planar.

13. The electronic acoustic device of claim 1 wherein the resonance frequency of the reference microphone is higher than the resonance frequency of the microphone.

14. The electronic acoustic device of claim 1 wherein the resonance frequency of the reference microphone is lower than the resonance frequency of the microphone.

15. The electronic acoustic device of claim 1 wherein the equalization module is one of an ASIC controller and a DSP controller.

16. An acoustic equalization method comprising:
    exciting a microphone and a reference microphone substantially simultaneously with a common acoustic signal to produce a transduced signal of the microphone and a transduced signal of the reference microphone, the microphone having a frequency response including a resonance frequency and the reference microphone having a frequency response including a resonance frequency, the resonance frequency of the reference microphone being different than the resonance frequency of the microphone;
    generating the transduced signal of the reference microphone responsive to the reference microphone receiving the common acoustic signal; and
    equalizing the frequency response of the microphone based on the transduced signal of the microphone and the transduced signal of the reference microphone.

17. The acoustic equalization method of claim 16 further comprising estimating a transfer function of the microphone based on the transduced signal of the microphone and the transduced signal of the reference microphone.

18. The acoustic equalization method of claim 17 wherein estimating the transfer function of the microphone comprises:
    estimating a power spectrum of the transduced signal of the reference microphone;
    calculating a cross-correlation of time-domain samples of the transduced signal of the microphone and the transduced signal of the reference microphone;
    calculating a frequency-domain power spectrum estimate of the cross-correlation; and
    dividing the frequency-domain power spectrum estimate of the cross-correlation by the power spectrum estimate of the transduced signal of the reference microphone to produce the estimated transfer function of the microphone.

19. The acoustic equalization method of claim 17 further comprising:
    determining an equalization function of the microphone based on the estimated transfer function; and
    equalizing the frequency response of the microphone by filtering the frequency response of the microphone with the equalization function.

20. The acoustic equalization method of claim 16 further comprising reconfiguring an adaptive filter with coefficients of the equalization function to adaptively filter the transduced signal of the microphone.

* * * * *

UNITED STATES PATENT AND TRADEMARK OFFICE
CERTIFICATE OF CORRECTION

PATENT NO. : 12,297,100 B2
APPLICATION NO. : 18/045885
DATED : May 13, 2025
INVENTOR(S) : Humberto Campanella-Pineda et al.

Page 1 of 1

It is certified that error appears in the above-identified patent and that said Letters Patent is hereby corrected as shown below:

In the Specification

Column 10, Line 11, delete "Ru" and insert -- $R_{12}$ --

In the Claims

Column 14, Lines 32-35, Claim 5, delete "dividing the frequency-domain power spectrum estimate of the transduced signal of the cross-correlation by the power spectrum estimate of the reference microphone to produce a transfer function of the microphone." and insert -- dividing the frequency-domain power spectrum estimate of the cross-correlation by the power spectrum estimate of the transduced signal of the reference microphone to produce a transfer function of the microphone. --

Signed and Sealed this
Tenth Day of June, 2025

Coke Morgan Stewart
*Acting Director of the United States Patent and Trademark Office*